US010004142B1

(12) United States Patent
Wightman

(10) Patent No.: US 10,004,142 B1
(45) Date of Patent: Jun. 19, 2018

(54) CIRCUIT BOARD ASSEMBLY HAVING A SECONDARY CIRCUIT BOARD ABUTTING A PRIMARY CIRCUIT BOARD, WITH AT LEAST ONE SENSOR DISPOSED ON THE SECONDARY CIRCUIT BOARD

(71) Applicant: BorgWarner Inc., Auburn Hills, MI (US)

(72) Inventor: Brian C. Wightman, Davisburg, MI (US)

(73) Assignee: BorgWarner Inc., Auburn Hills, MI (US)

( * ) Notice: Subject to any disclaimer, the term of this patent is extended or adjusted under 35 U.S.C. 154(b) by 0 days. days.

(21) Appl. No.: 15/492,114

(22) Filed: Apr. 20, 2017

(51) Int. Cl.
*H02K 1/18* (2006.01)
*H05K 1/14* (2006.01)
*H01R 12/52* (2011.01)
*H02K 11/215* (2016.01)
*H02K 11/33* (2016.01)
*H05K 1/18* (2006.01)
*H05K 3/36* (2006.01)

(52) U.S. Cl.
CPC ............ *H05K 1/144* (2013.01); *H01R 12/52* (2013.01); *H02K 11/215* (2016.01); *H02K 11/33* (2016.01); *H05K 1/18* (2013.01); *H05K 3/368* (2013.01); *H05K 2201/041* (2013.01); *H05K 2201/10151* (2013.01)

(58) Field of Classification Search
CPC ...... H02K 11/215; H02K 11/33; H01R 12/52; H05K 1/144; H05K 1/18; H05K 3/368; H05K 2201/041; H05K 2201/10151
USPC ...................................................... 310/68 B
See application file for complete search history.

(56) References Cited

U.S. PATENT DOCUMENTS

| 4,898,759 | A | 2/1990 | Hoover et al. |
| 5,321,585 | A | 6/1994 | Trittschuh, III et al. |
| 6,020,660 | A | 2/2000 | Wright |
| 6,310,455 | B1 | 10/2001 | Siraky et al. |
| 6,538,403 | B2 | 3/2003 | Gorti et al. |
| 7,503,278 | B2 | 3/2009 | Sigg et al. |
| 8,316,830 | B2 | 11/2012 | Keefover et al. |
| 8,704,417 | B2 | 4/2014 | Kamogi |
| 2009/0155097 | A1 | 6/2009 | Winkler |

(Continued)

OTHER PUBLICATIONS

U.S. Appl. No. 15/492,051, filed Apr. 20, 2017, 36 pages.

*Primary Examiner* — Michael Andrews
(74) *Attorney, Agent, or Firm* — Howard & Howard Attorneys PLLC

(57) ABSTRACT

A circuit board assembly includes a primary circuit board extending in a first plane and configured to control electrical distribution and a secondary circuit board extending in a second plane, different from the first plane, with the primary and secondary circuit boards spaced from and substantially parallel with one another, and with the secondary circuit board abutting the primary circuit board such that the primary and secondary circuit boards are electrically coupled to one another. The circuit board assembly further includes at least one sensor disposed on the secondary circuit board and electrically coupled to the secondary circuit board such that the at least one sensor is electrically coupled to the primary circuit board through the secondary circuit board, with the secondary circuit board positioning the at least one sensor in proximity with the at least one magnet for detecting the position of the at least one magnet.

20 Claims, 11 Drawing Sheets

(56) References Cited

U.S. PATENT DOCUMENTS

| | | | |
|---|---|---|---|
| 2010/0320880 A1* | 12/2010 | Kamogi | H02K 11/33 310/68 B |
| 2014/0028161 A1* | 1/2014 | Kamogi | H02K 11/33 310/68 D |
| 2015/0047553 A1 | 2/2015 | Heinrich et al. | |
| 2015/0378153 A1 | 12/2015 | Kodani et al. | |
| 2015/0380990 A1* | 12/2015 | Flanary | H02K 11/33 310/68 B |
| 2015/0381017 A1 | 12/2015 | Kitaji et al. | |
| 2016/0056692 A1 | 2/2016 | Suzuki | |
| 2016/0079827 A1 | 3/2016 | Kim | |
| 2016/0164348 A1 | 6/2016 | Mellere | |

* cited by examiner

CIRCUIT BOARD ASSEMBLY HAVING A SECONDARY CIRCUIT BOARD ABUTTING A PRIMARY CIRCUIT BOARD, WITH AT LEAST ONE SENSOR DISPOSED ON THE SECONDARY CIRCUIT BOARD

BACKGROUND OF THE INVENTION

1. Field of the Invention

A circuit board assembly for use with a motor assembly.

2. Description of Related Art

Many motor assemblies use sensors to detect the position of a drive shaft of the motor assembly, and thereby to control the rotation of the drive shaft. In one example, the motor assembly includes a plurality of sensors spaced from (but electrically connected with) a printed circuit board, which distributes electricity throughout the motor assembly. The motor assembly further includes a plurality of sensor magnets (separate from the motor magnets which rotate the drive shaft) which are fixed to the drive shaft. The sensor magnets are in proximity of the sensors, to allow the sensors to detect the position of the sensor magnets as they rotate with the drive shaft. This in turn allows the sensors to detect the position of drive shaft. By detecting the position of the drive shaft, the printed circuit board may deliver electricity when needed to control the speed and acceleration of the drive shaft.

Although useful, the motor assembly requires sensor magnets (in addition to the motor magnets) to detect the position of the drive shaft. Furthermore, the sensors must be mounted to a frame or a housing of the motor assembly to position the sensors in proximity with the sensor magnets. In doing so, the packaging and the electrical connection of the sensors becomes more complex. As such, there remains a need to provide an improved motor assembly.

SUMMARY OF THE INVENTION AND ADVANTAGES

The subject invention provides for a circuit board assembly for use with a motor assembly. The motor assembly has a drive shaft which is rotatable about a shaft axis and at least one magnet coupled to and rotatable with the drive shaft about the shaft axis. The circuit board assembly comprises a primary circuit board extending in a first plane and configured to control electrical distribution and a secondary circuit board extending in a second plane, different from the first plane, with the primary and secondary circuit boards spaced from and substantially parallel with one another. The secondary circuit board abuts the primary circuit board such that the primary and secondary circuit boards are electrically coupled to one another.

The circuit board assembly further comprises at least one sensor disposed on the secondary circuit board and electrically coupled to the secondary circuit board such that the at least one sensor is electrically coupled to the primary circuit board through the secondary circuit board. The secondary circuit board positions the at least one sensor in proximity with the at least one magnet for detecting the position of the at least one magnet.

Accordingly, the circuit board assembly provides the advantage of positioning the at least one sensor with the secondary circuit board, which reduces complexity in positioning and electrically connecting the at least one sensor with the primary circuit board. Additionally, the primary and secondary circuit boards abutting and electrically coupled with one another may be accomplished by a pick and place process, which increases throughput and profitability. Furthermore, the positioning of the at least one sensor using the secondary circuit board may place the sensor in proximity of at least one magnet (more specifically, a motor magnet) which reduces the number of components needed operate the motor assembly.

BRIEF DESCRIPTION OF THE DRAWINGS

Advantages of the subject invention will be readily appreciated as the same becomes better understood by reference to the following detailed description when considered in connection with the accompanying drawings.

DETAILED DESCRIPTION OF THE INVENTION

Figure 1:
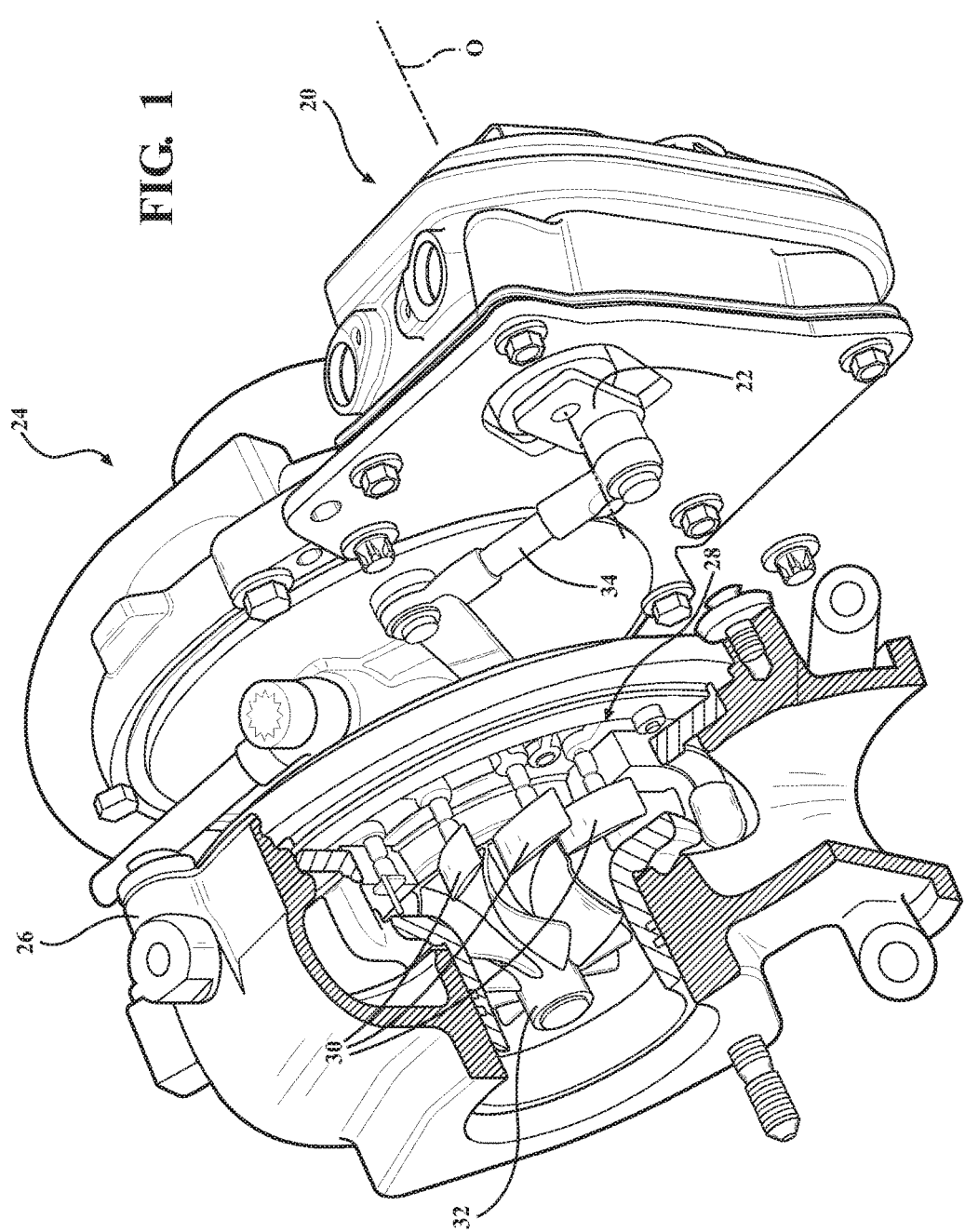
FIG. 1 is a perspective view of an actuated turbocharger system including an actuator assembly and a turbocharger.
Figure 2:
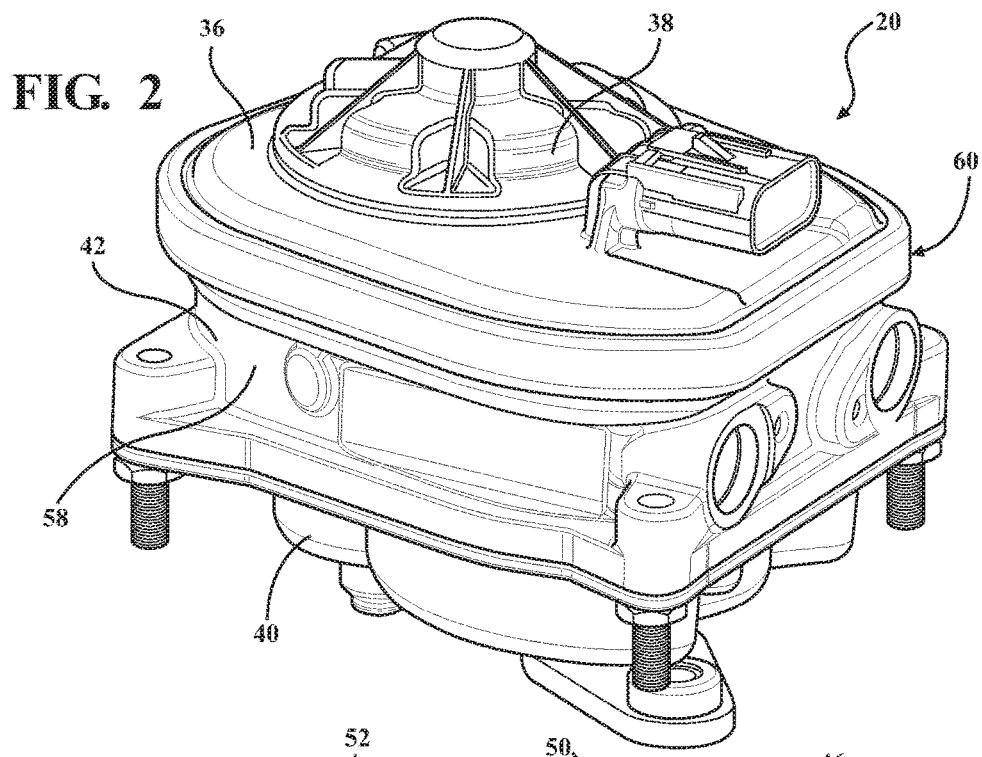
FIG. 2 is a perspective view of the actuator assembly including a housing having first, second, and third sections.

Referring to the Figures, wherein like numerals indicates like or corresponding parts throughout the several views, an actuator assembly 20 is generally shown in FIGS. 1 and 2. The actuator assembly 20 is typically used in a vehicle for moving an output shaft 22 between a plurality of positions.

In one example, the actuator assembly 20 is used with an actuated turbocharger system 24 for use with an engine of the vehicle, as shown in FIG. 1. More specifically, the actuated turbocharger system 24 controls the flow of a fluid to or from the engine. For example, the vehicle may comprise the engine, an intake manifold configured to flow air into the engine, and an exhaust manifold configured to flow exhaust out of the engine.

The actuated turbocharger system 24 comprises a turbocharger 26 for pressurizing air into the engine. The turbocharger 26 is fluidly coupled with each of the intake manifold and the exhaust manifold to increase flow of the air into the engine by way of utilizing the energy of the moving exhaust flowing out of the engine, as is commonly known to those having ordinary skill in the art. The actuated turbocharger system 24 controls the pressure and the flow of the air from the turbocharger 26 into the engine through the intake manifold, which is commonly referred to as boost pressure. The actuated turbocharger system 24 further comprises a pressure control mechanism 28 coupled to the turbocharger 26 and movable between a plurality of states for regulating the pressure of the air produced by the turbocharger 26. The pressure control mechanism 28 may include variable vanes 30 fluidly coupled to a turbine 32 of the turbocharger 26, with the orientation of the variable vanes 30 changing as the pressure control mechanism 28 moves between the plurality of states to alter the flow of the fluid to the turbine 32 which regulate the speed at which the turbine 32 rotates and, in-turn, alters the pressure and the flow of the air from the turbocharger 26 into the intake manifold.

The output shaft 22 is coupled to the pressure control mechanism 28 and is movable between the plurality of positions corresponding with the plurality of states of the pressure control mechanism 28. More specifically, the actuated turbocharger system 24 may include a control shaft 34 coupled to each of the output shaft 22 and the variable vanes 30, with the movement of the output shaft 22 moving the control shaft 34, which changes the orientation of the variable vanes 30.

The output shaft 22 is described herein as a component which is separate from the actuator assembly 20, but operably coupled with the actuator assembly 20. However, one having skill in the art will appreciate that output shaft 22 could be included as a component of the actuator assembly 20.

The vehicle may further comprise an electronic control unit (ECU) and an actuator controller. The ECU may be connected to the actuator controller by a wire harness having multiple conductors and connectors. The actuator controller may also be connected to the actuator assembly 20 by a wire harness having multiple conductors and connectors. The actuator controller may be a separate component. Alternatively, the actuator controller may be integrated within one of the actuator assembly 20 and the ECU.

The ECU may provide an electrical position input signal to the actuator controller that may indicate a desired position of the output shaft 22 as controlled by the actuator assembly 20. The actuator controller may provide the necessary electrical control signal to the actuator assembly 20 to achieve the desired position of the output shaft 22.

The actuator assembly 20 may also provide feedback in the form of an electrical position output signal to the actuator controller. A "closed loop" control scheme may be used to maintain a desired position of the output shaft 22 as controlled by the actuator assembly 20 by comparing the feedback electrical position output signal value to a desired value and may adjust the electrical control signal to the actuator assembly 20 to maintain the resulting position of the output shaft 22 and the resultant fluid flow and boost pressure.

Although the actuator assembly 20 is shown in FIG. 1 controlling the state of the pressure control mechanism 28 of the actuated turbocharger system 24, one having skill in the art will appreciate that the actuator assembly 20 may be used anywhere within automobiles for controlling the flow of a fluid to devices other than the turbocharger system 24. As non-limiting examples, the actuator assembly 20 may be used to control wastegate valves, exhaust throttles, exhaust gas recirculation (EGR) valves, and intake throttles.

As shown in FIGS. 2, 7, 13, and 14, the actuator assembly 20 may comprise a housing 36 having at least a first section 38, a second section 40, and a third section 42 each having an internal surface 44. The third section 42 is positioned between the first and second sections 38, 40 such that the internal surfaces 44a, 44c of the first and third sections 38, 42 at least partially define a first cavity 46 and the internal surfaces 44b, 44c of the second and third sections 40, 42 at least partially define a second cavity 48. The first, second, and third sections 38, 40, 42 may be referred to by different names to those having skill in the art. More specifically, the first section 38 may be referred to in the art as a motor housing, the second section 40 may be referred to in the art as an output housing, and the third section may be referred to in the art as an intermediate housing. It is to be appreciated that the first, second, and third sections 38, 40, 42 may be referred to by any suitable name.

Figure 3:
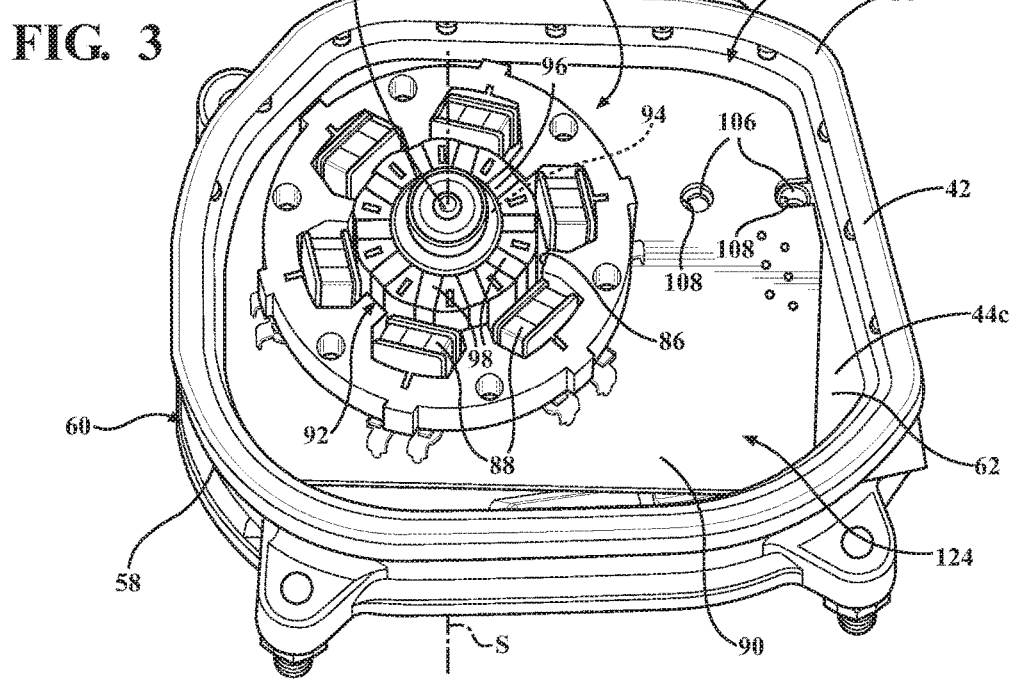
FIG. 3 is a perspective view of the second and third sections of the housing and showing a motor assembly of the actuator assembly.
Figure 5:
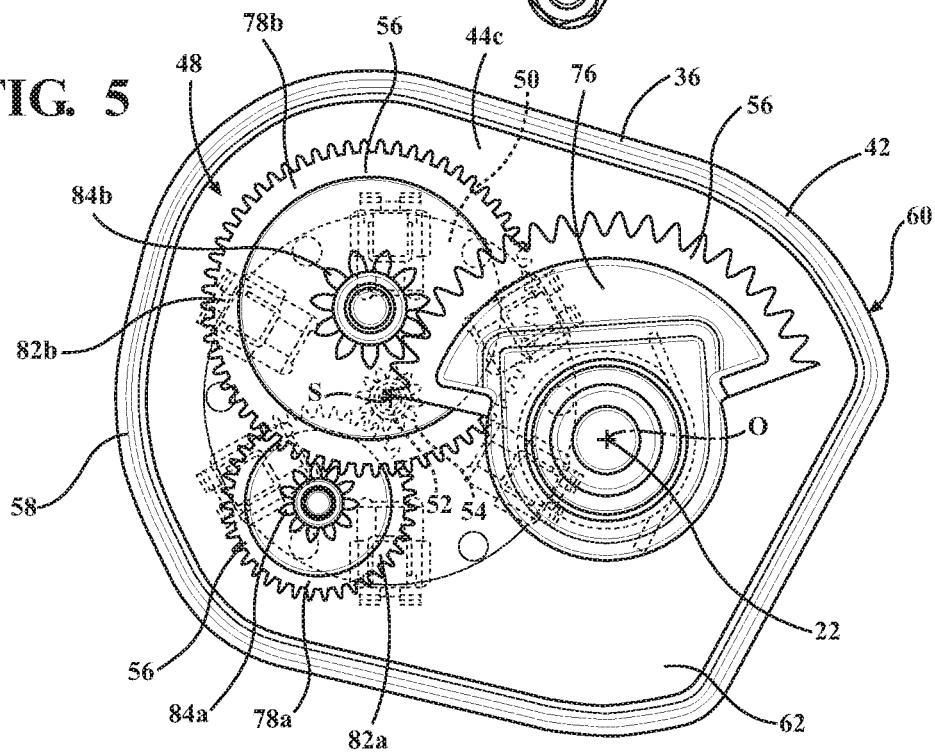
FIG. 5 is a bottom elevational view of the third section of the housing and the at least one drive gear, the first and second intermediate gears, and the output gear as hidden.
Figure 7:
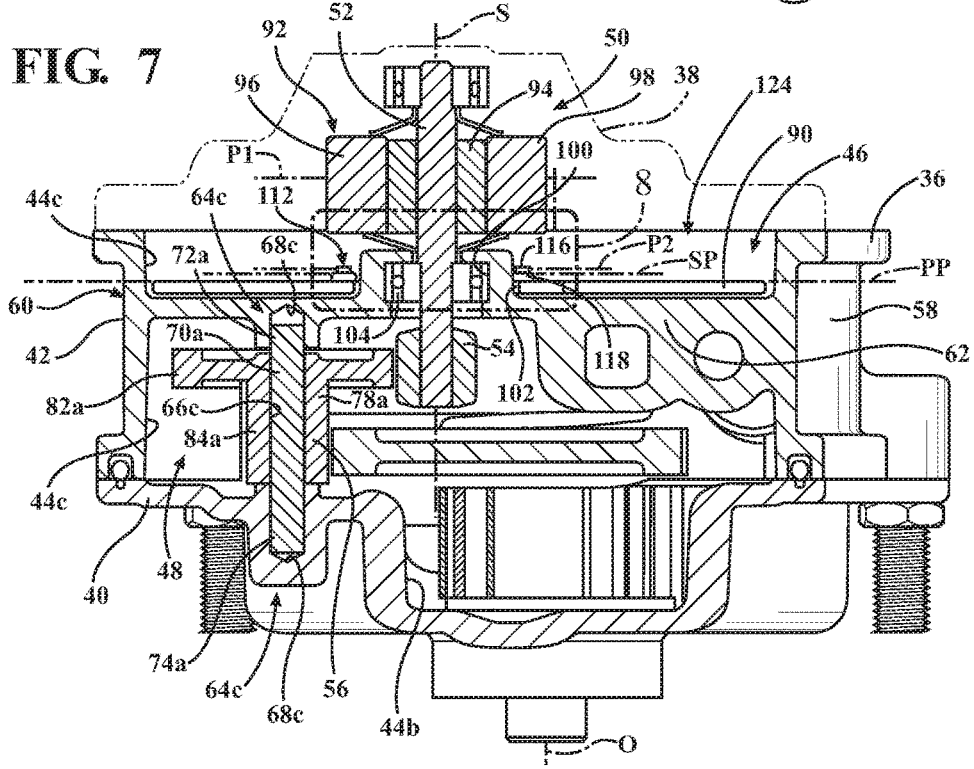
FIG. 7 is a cross-sectional view taken along 7-7 in FIG. 6, showing a magnet group coupled to the rotor and the at least one drive gear engaging the first intermediate gear.
Figure 9:
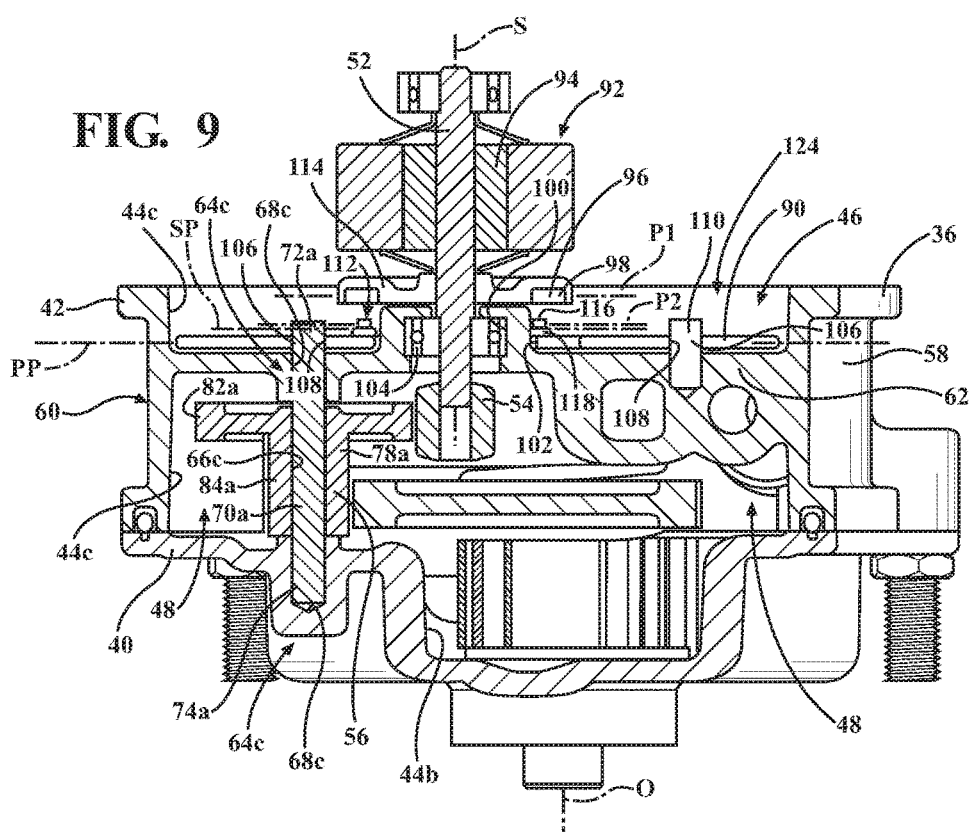
FIG. 9 is a cross-sectional view of the second and third sections of the housing, the at least one drive gear engaging the first intermediate gear, and the magnet group coupled to a drive shaft.
Figure 14:
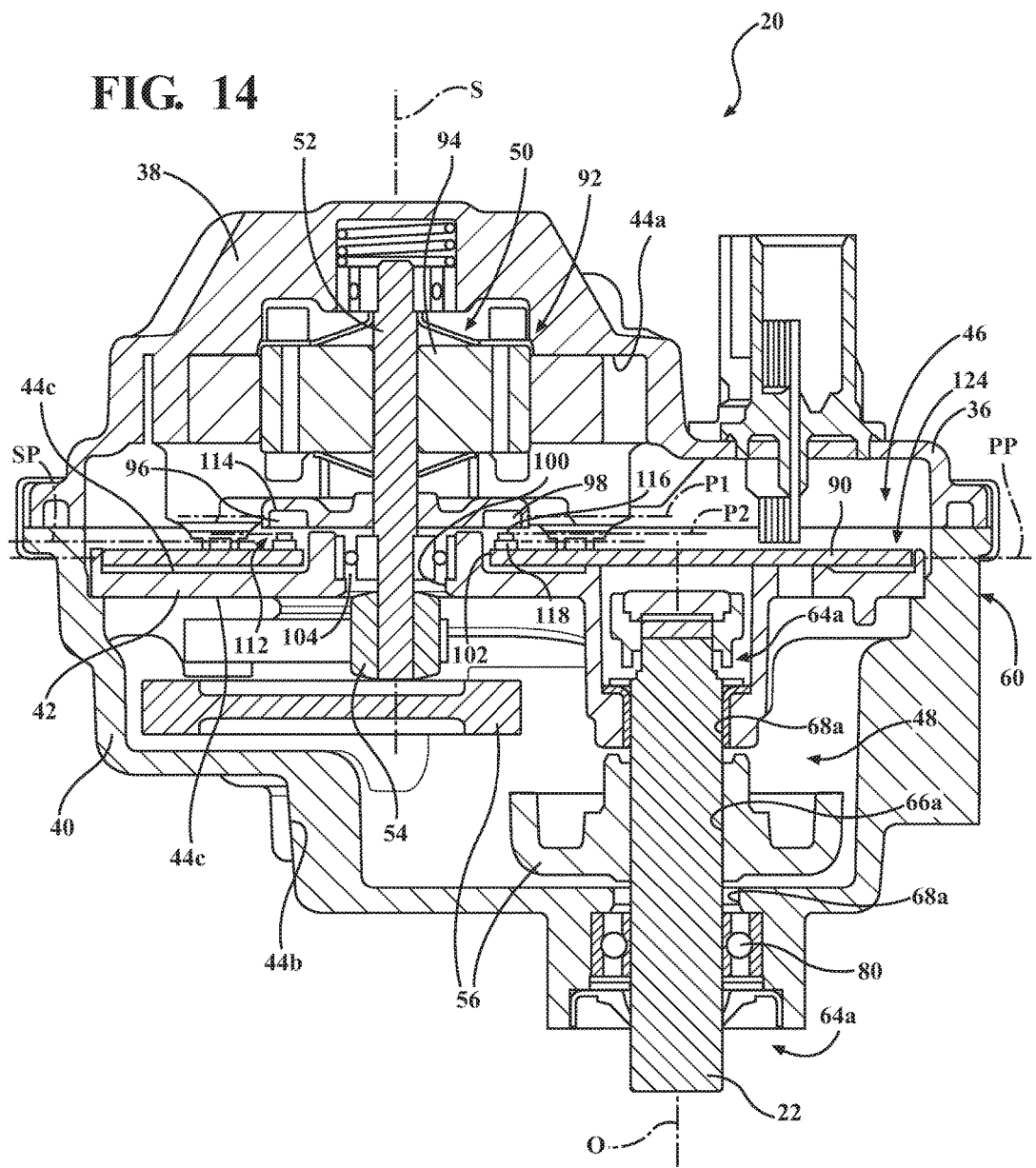
FIG. 14 is a cross-sectional view of the actuator assembly taken along 14-14 in FIG. 13, and showing the third section enveloped by the first and second sections.
Figure 16:
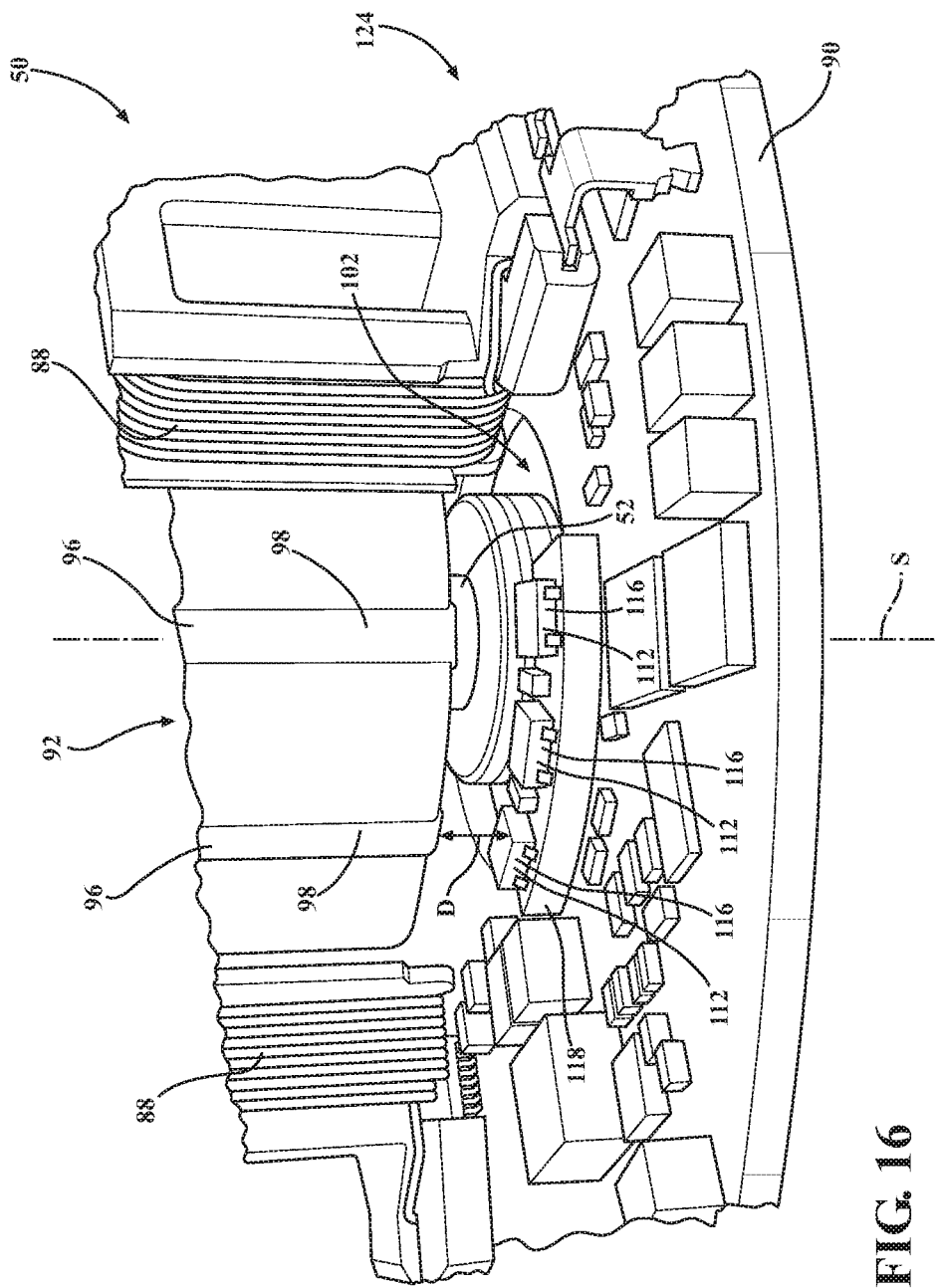
FIG. 16 is section view of the motor assembly showing the primary circuit board, the secondary circuit board, the at least one sensor, and at least one magnet.

As shown in FIGS. 3, 5, and 16, the actuator assembly 20 further comprises a motor assembly 50 comprising a drive shaft 52 rotatable about a shaft axis S and capable of transmitting rotational force with the drive shaft 52. The third section 42 of the housing 36 may define an aperture 100 between the first and second cavities 46, 48 and aligned with the shaft axis S, as shown in FIGS. 7, 9, and 14. The motor assembly 50 is at least partially disposed in the first cavity 46 and the drive shaft 52 extends through the aperture 100 of the third section 42 of the housing 36 such that the drive shaft 52 is at least partially disposed in the second cavity 48. The motor assembly 50 may be coupled to the third section 42 of the housing 36.

As shown in FIGS. 3 and 16, the motor assembly 50 comprises the drive shaft 52 rotatable about the shaft axis S, and at least one magnet 96 coupled to, and rotatable with the drive shaft 52 about the shaft axis S. The motor assembly 50 further comprises a circuit board assembly 124 spaced from the at least one magnet 96. As shown in FIGS. 7-9, 11, and 14-17, the circuit board assembly 124 comprises a primary circuit board 90 extending in a first plane PP and configured to control electrical distribution and a secondary circuit board 118 extending in a second plane SP, different from the first plane PP, with the primary and secondary circuit boards 90, 118 spaced from and substantially parallel with one another, and with the secondary circuit board 118 abutting the primary circuit board 90 such that the primary and secondary circuit boards 90, 118 are electrically coupled to one another.

The circuit board assembly 124 further comprises at least one sensor 112 disposed on the secondary circuit board 118 and electrically coupled to the secondary circuit board. 118 such that the at least one sensor 112 is electrically coupled to the primary circuit board 90 through the secondary circuit board 118, with the secondary circuit board 118 positioning the at least one sensor 112 in proximity with the at least one magnet 96 for detecting the position of the at least one magnet 96.

The motor assembly 50 may comprise a direct current (D.C.) motor. More specifically, as shown in the Figures, the motor assembly 50 may comprise a brushless D.C. motor. The D.C. motor may include brushes to produce motion. One having skill in the art will appreciate that the motor assembly 50 may comprise a stepper motor or any other suitable electrical device. The motor assembly 50 may be configured to be controlled by an electrical control signal. More specifically, at least one of the ECU and the actuator controller control the motor assembly 50 (and, moreover, the actuator assembly 20) by the electrical control signal. One having skill in the art will appreciate that the motor assembly 50 and the actuator assembly 20 may be controlled by any suitable means, such as a mechanical switch.

The motor assembly 50 may comprise a stator disposed in the first cavity 46 of the housing 36 and having a number of teeth shaped radially inward and defining an opening 86, which is substantially cylindrical. A plurality of coils 88 may be mounted to the stator on alternating teeth and may be connected to the primary circuit board 90. A rotor 92 may be disposed within the opening 86 and may be coupled to the drive shaft 52. The rotor 92 may comprise a hub 94 having a substantially cylindrical configuration about the shaft axis S, with the at least one magnet 96 coupled to the hub 94. More specifically, the at least one magnet 96 may be further defined as a motor magnet which facilitates rotation of the drive shaft 52 about the shaft axis S.

As shown in the FIGS. 3, 5, 16, and 17, the at least one magnet 96 may comprise a permanent magnet 98. The at least one magnet 96 may be a plurality of magnets 96 radially spaced about the shaft axis S. As such, the plurality of magnets 96 may be further defined as a plurality of permanent magnets 98, which will be further described below. One having skill in the art will appreciate that the at least one magnet 96 may be a single magnet 96 comprising a single permanent magnet 98. Moreover, one having skill in the art will appreciate that the at least one magnet 96 may be any suitable magnet, including, but not limited to, an electromechanical magnet.

Figure 8:
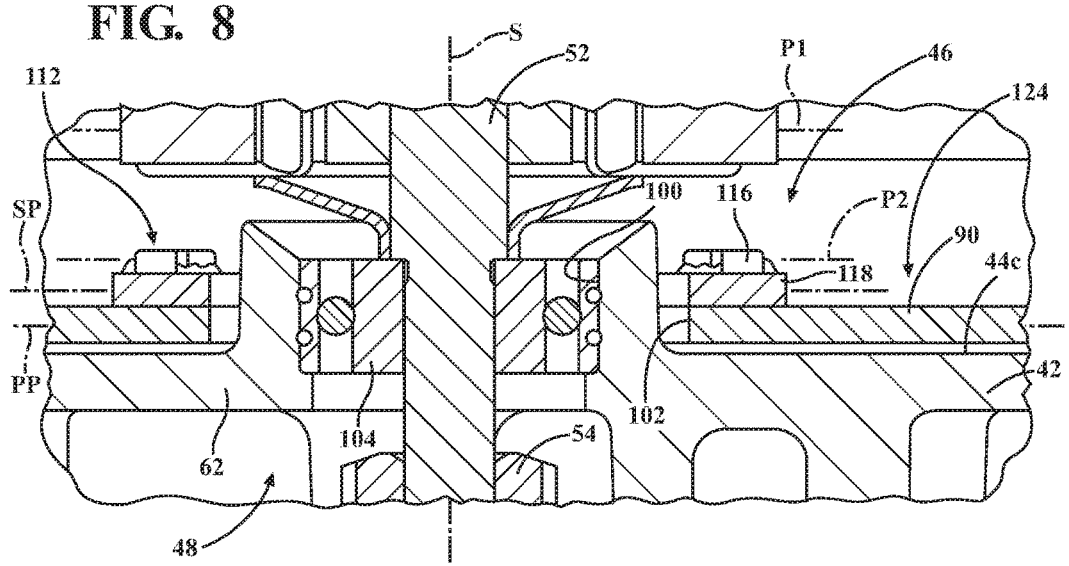
FIG. 8 is a cross-sectional view of a portion of actuator assembly and showing a primary circuit board, a secondary circuit board, and a sensor group.

As shown in FIG. 8, the third section 42 of the housing 36 may define the aperture 100 between the first and second cavities 46, 48 and aligned with the shaft axis S. The primary circuit board 90 may define a hole 102 aligned with the shaft axis S to accept the drive shaft 52 therethrough. Moreover, the primary circuit board 90 may define a hole 102 aligned with the aperture 100 of the third section 42. The drive shaft 52 may extend through the hole 102 and the aperture 100 to partially dispose the drive shaft 52 in each of the first and second cavities 46, 48. A bearing 104 may support the drive shaft 52 within the aperture 100 while allowing rotation of the drive shaft 52 about the shaft axis S.

Figure 15:
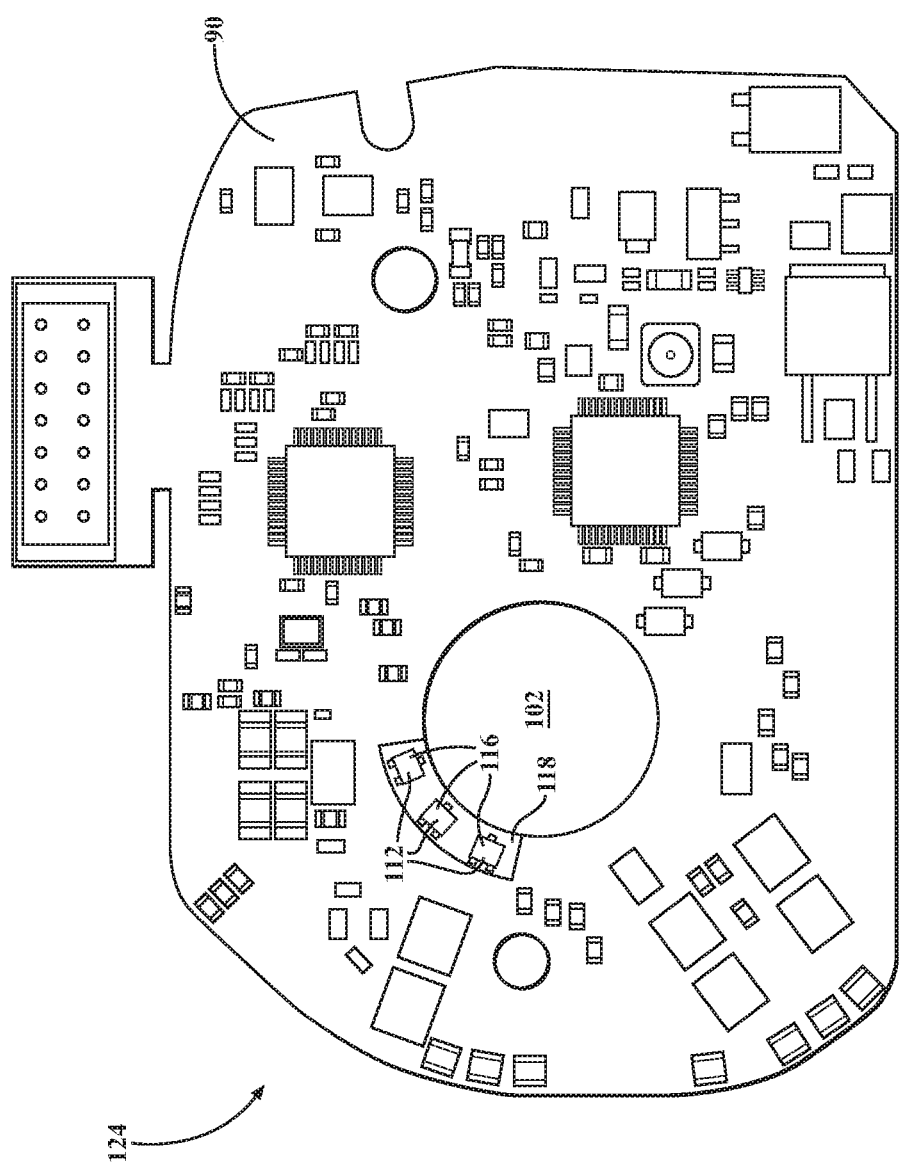
FIG. 15 is a top elevational view of a circuit board assembly of the motor assembly, showing a primary circuit board, a secondary circuit board, and at least one sensor.
Figure 17:
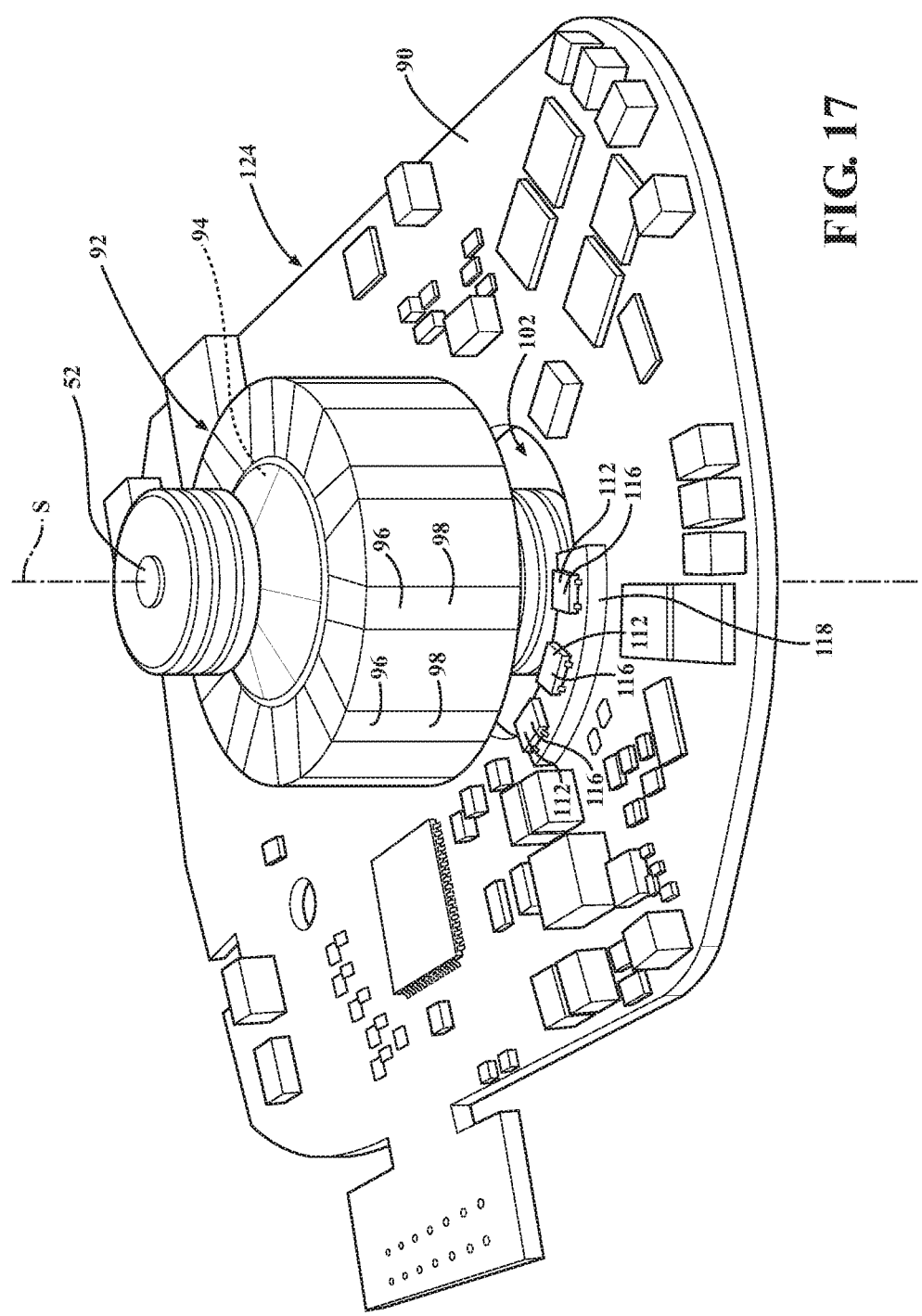
FIG. 17 is a perspective view of the circuit board assembly and a rotor of the motor assembly having the at least one magnet.

As shown in FIGS. 15-17, the secondary circuit board 118 may at least partially encircle the hole 102 of the primary circuit board 90. Moreover, the secondary circuit board 118 may have a semi-annular configuration about the hole 102 of the primary circuit board 90. The configuration of the secondary circuit board 118 will be better understood in the further description below. One having skill in the art will appreciate that the secondary circuit board 118 may have any suitable shape and configuration about the drive shaft 52.

As described above, the primary circuit board 90 may be configured to control electrical distribution within the motor assembly 50. For example, the primary circuit board 90 may be electrically coupled with the coils 88, with the primary circuit board 90 controlling electrical distribution to the coils 88 to control the rotation of the drive shaft 52 of the motor assembly 50. The distribution of electricity from the primary circuit board 90 to the coils 88 may commutate the motor assembly 50. More specifically, the motor assembly 50 may be commutated by continuously switching the electrical control signal to the coils 88 to provide an electromagnetic field that may cause rotation of the rotor 92 and the drive shaft 52.

As shown in FIGS. 7-9, 11, and 14-17, the circuit board assembly 124 may include the at least one sensor 112 operatively coupled to the primary circuit board 90, through the secondary circuit board 118, and the at least one magnet 96 spaced from the at least one sensor 112 and fixed to the drive shaft 52, with the at least one sensor 112 detecting the position of the at least one magnet 96 and the drive shaft 52 to control rotation of the drive shaft 52. As described above, the at least one magnet 96 may be coupled to the rotor 92, which is fixed to the drive shaft 52. Alternatively, the at least one magnet 96 may be separate from the rotor 92. For example, FIGS. 9 and 14 show the at least one magnet 96 separate and spaced from the rotor 92. Said differently, the at least one magnet 96 may not facilitate rotation of the drive shaft 52 about the shaft axis S. Furthermore, when separate and spaced from the rotor 92, the at least one magnet 96 may be fixed to the drive shaft 52 by an overmold 114. The at least one magnet 96 and the overmold 114 may have a substantially annular configuration about the shaft axis S. The at least one magnet 96 and the overmold 114 may have any suitable shape and configuration. As described above, the at least one magnet 96 may comprise a single permanent magnet 98 or a plurality of permanent magnets 98. Moreover, the at least one magnet 96 may be a single permanent magnet 98 that is segmented to have several alternating magnetic poles.

As shown in FIGS. 15-17, the at least one sensor 112 may be a plurality of sensors 112 radially spaced about the shaft axis S on the secondary circuit board 118. Furthermore, the plurality of sensors 112 may be defined along a sensor plane P2 transverse to the shaft axis S, as shown in FIGS. 7-9, 11, and 14. The sensor plane P2 may be transverse to the shaft axis S. More specifically, the sensor plane P2 may be substantially perpendicular to the shaft axis S. Furthermore, the plurality of magnets 96 may be spaced about the shaft axis S and disposed along a magnet plane P1 that is substantially parallel to the sensor plane P2 of the plurality of sensors 112. Moreover, the plurality of magnets 96 may be disposed radially about the shaft axis S on the magnet plane P1, as shown in FIGS. 7-9, 11, and 14. The magnet plane P1 may be transverse to the shaft axis S. More specifically, the magnet plane P1 may be substantially perpendicular to the shaft axis S. One having skill in the art will appreciate that the magnet plane P1 may be disposed at any suitable angle relative to the shaft axis S. Moreover, the sensor plane P2 may be substantially parallel to the magnet plane P1. One having skill in the art will appreciate that the sensor plane P2 may be disposed at any suitable angle relative to the shaft axis S.

As described above, the at least one sensor 112 may comprise the plurality of sensors 112, as shown in FIGS.

15-17. Alternatively, one having skill in the art will appreciate that the at least one sensor 112 may comprise a single sensor 112. The at least one sensor 112 may be further defined as at least one Hall Effect sensor 116, with the at least one Hall Effect sensor 116 detecting the position of the at least one magnet 96. Alternatively, the at least one sensor 112 may be further defined as an inductive sensor or a magneto-resistive sensor for sensing a change in the magnetic field of the at least one magnet 96 as the at least one magnet 96 rotates with the drive shaft 52. Furthermore, the at least one sensor 112 may be an absolute position sensor or a torque sensor.

As shown in FIGS. 7, 9, 14, 16, and 17, the at least one sensor 112 may be in proximity of the at least one sensor 112 to sense the change of the magnetic field of the at least one magnet 96. The secondary circuit board 118 may be positioned between the primary circuit board 90 and the at least one magnet 96 to locate the at least one sensor 112 in proximity with the at least one magnet 96. As described above, the secondary circuit board 118 and the at least one sensor 112 may at least partially encircle the drive shaft 52.

The secondary circuit board 118 provides a direct electrical coupling between the at least one sensor 112 and the primary circuit board 90. More specifically, the secondary circuit board 118 is electrically coupled with both the primary circuit board 90 and the at least one sensor 112 with electric signals transmitted between the primary circuit board 90 and the at least one sensor 112 through the secondary circuit board 118. Furthermore, the at least one sensor 112 lies along, and is fixed to, the secondary circuit board 118 and the secondary circuit board 118 lies along, and is fixed to, the primary circuit board 90. More specifically, the secondary circuit board 118 is surface mounted to the primary circuit board 90 by a solder. Said differently, the secondary circuit board 118 may be assembled to the primary circuit board 90 by, what is referred to in the art as, pick and place assembly. Pick and place assembly refers to placing the secondary circuit board 118 on the primary circuit board 90 and heating the primary and secondary circuit boards 90, 118 to distribute the solder (disposed on at least one of the primary and secondary circuit boards 90, 118) therebetween, and complete the electrical connections between the primary and secondary circuit boards 90, 118. As such, one having skill in the art will appreciate that the primary and secondary circuit boards 90, 118 may be referred to as abutting one another, even with the solder disposed therebetween. Furthermore, one having skill in the art will appreciate that the primary and secondary circuit boards 90, 118 may abut one another and may be electrically coupled to one another without the solder. Even further, the primary and secondary circuit boards 90, 118 may be coupled to one another by any suitable manner, including mechanical fastening. Because of the surface mounting, the at least one sensor 112 is fixed to and supported by the primary circuit board 90, which removes the need to separately support the at least one sensor 112, spaced from the primary circuit board 90, to place the at least one sensor 112 in proximity of the at least one magnet 96.

The primary circuit board 90 may provide an electrical control signal to at least one of the coils 88, which may produce an electromagnetic field that will attract or repel the at least one magnet 96 located on the rotor 92, which may cause the rotor 92 and the drive shaft 52 to rotate. The at least one sensor 112 may detect a change in the magnetic field of the at least one magnet 96. When a sufficient change in the magnetic field is detected, the primary circuit board 90 may switch the electrical control signal to another of one of the coils 88 to sustain rotation of the rotor 92 and the drive shaft 52.

As shown in FIGS. 15-17, the plurality of sensors 112 may be further defined as three sensors 112 for detecting the magnet 96 with the motor assembly 50 in a three-phase configuration. Furthermore, the plurality of sensors 112 may be radially spaced around the shaft axis S in accordance with the following formula:

$$D = K * 120° / P.$$

In the formula, D is the radial spacing of the sensors 112 in mechanical degrees, K is a scalar value that is used as a multiplier to increase the spacing of the plurality of sensors 112 and P is number of pole pairs in the motor assembly 50. In the embodiment shown, the K value is one and the number of pole pairs is five, which yields a radial spacing between the plurality of sensors 112 of 24 mechanical degrees. One having skill in the art will appreciate that the variables described above will vary depending on the type of motor assembly 50.

The three sensors 112 are positioned as described above to orient the sensors 112 with the stator to switch the states of the coils 88 at peak torque rotor 92 angles, which results in correct sensor 112 commutation.

As described above, the at least one sensor 112 may be disposed on the sensor plane P2 and the at least one magnet 96 may be disposed on the magnet plane P1, substantially parallel to the sensor plane P2.

As shown in FIG. 16, the at least one sensor 112 and the at least one magnet 96 may be spaced from one another a distance D. More specifically, the distance D may be measured where the at least one sensor 112 and the at least one magnet 96 are closest to one another. The distance D is commonly referred to by those skilled in the art as an air gap. When the at least one sensor 112 is the Hall Effect sensor 116, the distance D between the at least one sensor 112 and the at least one magnet 96 is dictated by parameters of the Hall Effect, which include variations in temperature and magnet flux. In one embodiment, the distance D is within a range between 0 mm and 8 mm. In another embodiment, the distance D is within a range between 0 mm and 1 mm. In yet another embodiment, the distance D is 0.5 mm. One having skill in the art will appreciate that the distance D may vary depending on the type of sensor 112 used, as well as the type and operative temperature of the motor assembly 50. The distance D between the at least one sensor 112 and the at least one magnet 96P1 may be determined by the thickness of the secondary circuit board 118. Said differently, by changing the thickness of the secondary circuit board 118, the at least one sensor 112 may be adjusted closer to or farther away from the at least one magnet 96.

In addition to placing the at least one sensor 112 in proximity with the at least one magnet 96, the secondary circuit board 118 also provides the benefit of allowing the at least one magnet 96 to be spaced a greater distance from the primary circuit board 90 than if the at least one sensor 112 was mounted directly to the primary circuit board 90. Spacing the at least one magnet 96 a greater distance from the primary circuit board 90 reduces the levels of magnet flux which act on the primary circuit board 90 (and, in particular, the levels of magnetic flux which act on magnetic-sensitive components disposed on or within the primary circuit board 90).

As shown in FIGS. 4, 5, 7, 9, 11, and 14, the actuator assembly 20 may further comprise at least one drive gear 54 disposed within the second cavity 48 of the housing 36. The at least one drive gear 54 may be fixed to and rotatable with the drive shaft 52 of the motor assembly 50. The actuator assembly 20 may further comprise at least one driven gear 56 disposed within the second cavity 48 of the housing 36 and configured to be rotatably coupled with the output shaft 22, which is moveable between the plurality of positions. The at least one driven gear 56 may be coupled to the third section 42 of the housing 36. The at least one driven gear 56 may be rotatably coupled with the at least one drive gear 54 such that the at least one driven gear 56 is capable of transmitting rotation from the drive shaft 52 of the motor assembly 50 to the output shaft 22 for moving the output shaft 22 between the plurality of positions.

The actuator assembly 20 may produce rotary or linear motion. For illustrative purposes, the actuator assembly 20 shown in the Figures produces rotary motion.

As shown in FIGS. 2, 3, 5, 7, 9, 10, and 11, the third section 42 may have a flange 58 at least partially defining an exterior 60 of the housing 36 and a body 62 extending from the flange 58 and enveloped by the flange 58 and the first and second sections 38, 40 such that the body 62 is entirely disposed within the housing 36. The body 62 may have a substantially planar configuration, with the body 62 of the third section 42 separating the first and second cavities 46, 48. As such, the at least one driven gear 56 may be coupled to the body 62 of the third section 42 of the housing 36. The flange 58 may extend from the body 62 in opposing directions such that the flange 58 and the body 62 of the third section 42 define a portion of the first cavity 46 and a portion of the second cavity 48. More specifically, the flange 58 may extend in opposing directions substantially perpendicular from the body 62. Moreover, the body 62 may define a perimeter, with the flange 58 extending from the body 62 along the perimeter such that the flange 58 continuously surrounds the body 62. The first, second, and third sections 38, 40, 42 may abut one another and may be sealed at the abutment to prevent debris from entering the first and second cavities 46, 48.

Alternatively, the third section 42 of the housing 36 may be enveloped by the first and second sections 38, 40 of the housing 36 such that the third section 42 is entirely disposed within the housing 36, as shown in FIG. 14. As such, the entire third section 42 may have a substantially planar configuration and may separate the first and second cavities 46, 48. The first and second sections 38, 40 may abut one another and may be sealed at the abutment to prevent debris from entering the first and second cavities 46, 48. One having skill in the art will appreciate that the third section 42 may have any suitable shape, size, and configuration.

As shown in FIGS. 7, 9, 11, and 14, the at least one driven gear 56 may be coupled to the second section 40 of the housing 36. As such, the at least one driven gear 56 may be coupled to both the second section 40 and the third section 42 of the housing 36. More specifically, the internal surfaces 44b, 44c of both of the second and third sections 40, 42 of the housing 36 may define a gear retention feature 64 to facilitate coupling of the at least one driven gear 56 with the second and third sections 40, 42 of the housing 36.

As shown in FIGS. 7, 9, 11, and 14, the at least one driven gear 56 may define a hole 66 extending therethrough, with the hole 66 corresponding with the gear retention feature 64 to facilitate coupling of the at least one driven gear 56 with the housing 36. Typically, the hole 66 is concentric with the at least one driven gear 56 such that the hole 66 extends through a center of the at least one driven gear 56. One having skill in the art will appreciate that the hole 66 may be defined anywhere within the at least one driven gear 56.

Each of the second and third sections 40, 42 of the housing 36 may individually define a pocket 68, which may collectively define the gear retention feature 64. More specifically, the internal surfaces 44b, 44c of the second and third sections 40, 42 of the housing 36 may individually define the pocket 68.

Figure 11:
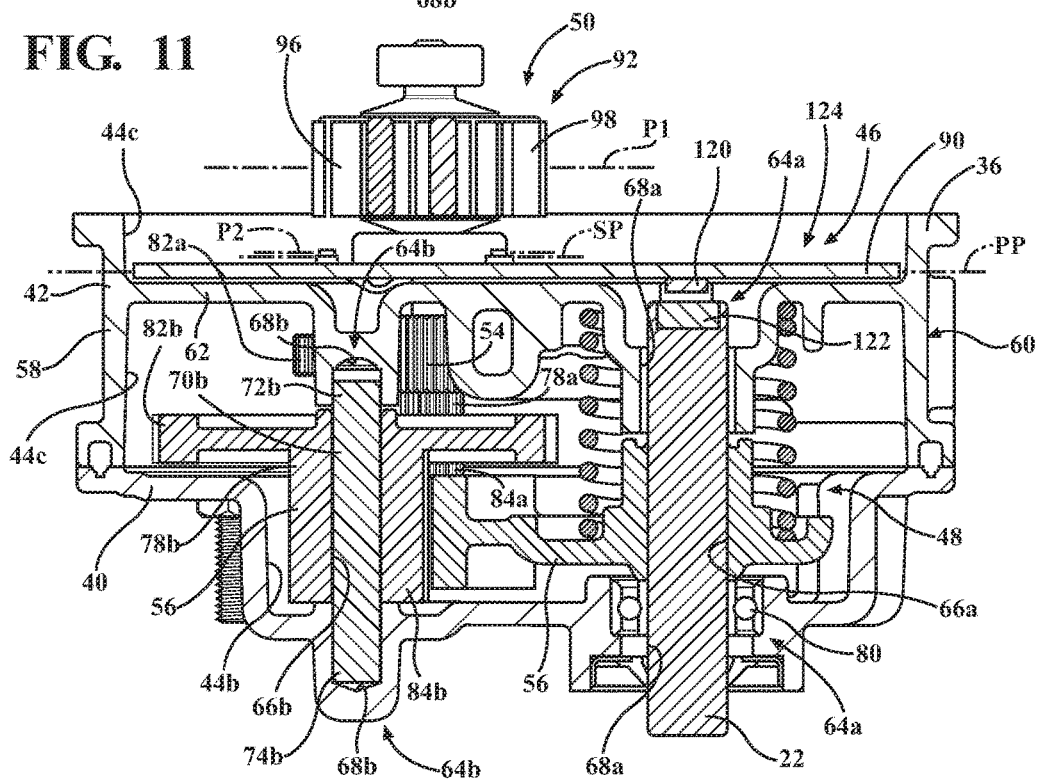
FIG. 11 is a cross-sectional view of the second and third sections of the housing and the second intermediate gear engaging the output gear.

As shown in FIGS. 7, 9, and 11, the actuator assembly 20 may further comprise a gear pin 70 extending between a first end 72 and a second end 74 through the hole 66 of the at least one driven gear 56. The first end 72 of the gear pin 70 may be disposed in the pocket 68 defined by the third section 42 of the housing 36 and the second end 74 of the gear pin 70 may be disposed in the pocket 68 defined by the second section 40 of the housing 36 to facilitate coupling of the pin 70 with the second and third sections 40, 42 of the housing 36, and provide for rotation of the at least one driven gear 56 about the axis of the pin 70. More specifically, each of the pockets 68 may have a cylindrical configuration, with the pockets 68 opening toward one another to receive the gear pin 70 and operably couple the gear pin 70 to the housing 36. The gear pin 70 may have a cylindrical configuration corresponding to the cylindrical configurations of the pockets 68. The cylindrical configuration of the pockets 68 accept the gear pin 70 and retain the gear pin 70 laterally (i.e., each pocket 68 prevents movement of the gear pin 70 in a direction other than toward the other pocket 68).

The coupling of the at least one driven gear 56 with both of the second and third sections 40, 42 provides the advantage of supporting the at least one driven gear 56 on two opposing sides within the second cavity 48 with the motor assembly 50 separated from the at least one driven gear 56 and disposed within the first cavity 46. As such, the at least one driven gear 56 is fully supported by the housing 36 without interfering with the motor assembly 50 (i.e., without engaging the motor assembly 50).

Moreover, supporting the at least one driven gear 56 on two opposing sides reduces a bending stress on the gear pin 70 while maintaining desirable packaging space. Furthermore, the present invention provides for accurate positioning of the at least one driven gear 56 components by locating and aligning the at least one driven gear 56 with the second and third sections 40, 42 of the housing 36 using the gear retention feature 64 of the second and third sections 40, 42.

As shown in FIGS. 7, 9, and 14, the motor assembly 50 has the drive shaft 52 rotatable about the shaft axis S and capable of transmitting rotational force with the drive shaft 52, as described above. The at least one drive gear 54 is fixed to and rotatable with the drive shaft 52 about the shaft axis S. As such, the at least one drive gear 54 is fixed to the drive shaft 52 such that motion of the drive shaft 52 is imparted directly to the at least one drive gear 54. One having skill in the art will appreciate that the at least one drive gear 54 may be coupled to the drive shaft 52 in any suitable way.

Figure 4:
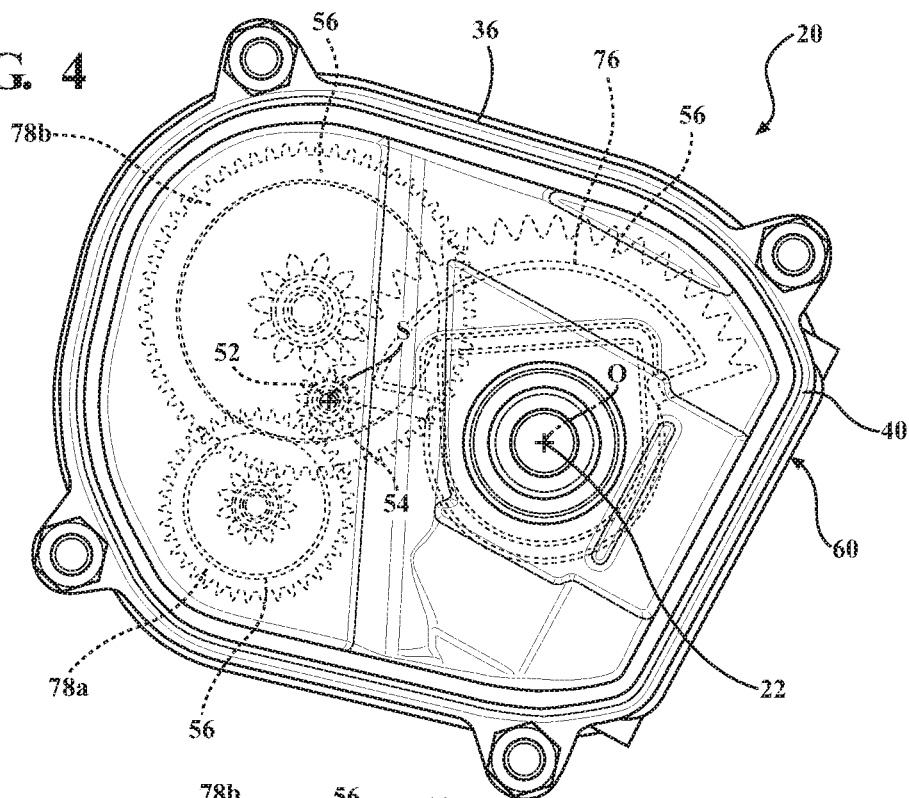
FIG. 4 is a bottom elevational view of the actuator assembly showing at least one drive gear, first and second intermediate gears, and an output gear as hidden.

The at least one drive gear 54 may have gear teeth extending radially from the drive shaft 52. As shown in FIGS. 4 and 5, the at least one drive gear 54 may have a substantially circular configuration. As such, the at least one drive gear 54 may be referred to as a spur gear. Furthermore, the at least one drive gear 54 may be comparatively smaller than the at least one driven gear 56. As such, the at least one drive gear 54 may be referred to as a pinion gear. One having skill in the art will appreciate that the at least one drive gear 54 may have any suitable gear configuration, such as a bevel gear configuration. As shown in FIGS. 7, 9, and 14, the at least one drive gear 54 is a single drive gear. One having skill in the art will appreciate that the at least one drive gear 54 may be a plurality of drive gears without escaping the scope of the subject invention.

As shown in FIGS. 4, 5, 11, and 14, the at least one driven gear 56 may include an output gear 76 configured to be coupled with the output shaft 22, and at least one intermediate gear 78 engageable with each of the at least one drive gear 54 and the output gear 76 to transmit rotation from the at least one drive gear 54 to the output gear 76.

As shown in FIGS. 11 and 14, the at least one driven gear 56 may be fixed to and rotatable with the output shaft 22. The output shaft 22 may extend through the housing 36 from the cavity along an output axis O. More specifically, the output shaft 22 may extend through the second section 40 of the housing 36. As described above, the housing 36 may define the gear retention feature 64 to facilitate coupling of the at least one driven gear 56 with the second and third sections 40, 42 of the housing 36. Because the at least one driven gear 56 has been further defined as the output gear 76 and the at least one intermediate gear 78, the gear retention feature 64 may be further defined as a plurality of gear retention features 64a, 64b, 64c, with the gear retention features 64a individually corresponding with the output gear 76 and the at least one intermediate gear 78. As such, the description of the gear retention feature 64 described above is applicable to both the output gear 76 and the at least one intermediate gear 78.

The output shaft 22 may be supported by the second and third sections 40, 42 of the housing 36 by the gear retention feature 64a. Moreover, the output shaft 22 (rather than the gear pin 70) extends through the hole 66a of the output gear 76 and may be disposed in the pockets 68a of each of the second and third sections 40, 42. The pocket 68a of the second section 40 may be open to the exterior 60 of the housing 36 such that the output shaft 22 may extend outside of the second cavity 48 of the housing 36. At least one of the pockets 68a of the second and third sections 40, 42 may include a bearing 80, which allows the output shaft 22 to rotate about the output axis O. The rotation of the at output gear 76 may rotate the output shaft 22 between the plurality of positions.

The output gear 76 may have gear teeth extending radially, as shown in FIGS. 4 and 5. The output gear 76 may have a partially circular configuration. As such, the output gear 76 may be referred to as a partial spur gear. Furthermore, the output gear 76 may be referred to as a sector gear. One having skill in the art will appreciate that the output gear 76 may have any suitable gear configuration, such as a complete spur gear or a bevel gear configuration.

Figure 10:
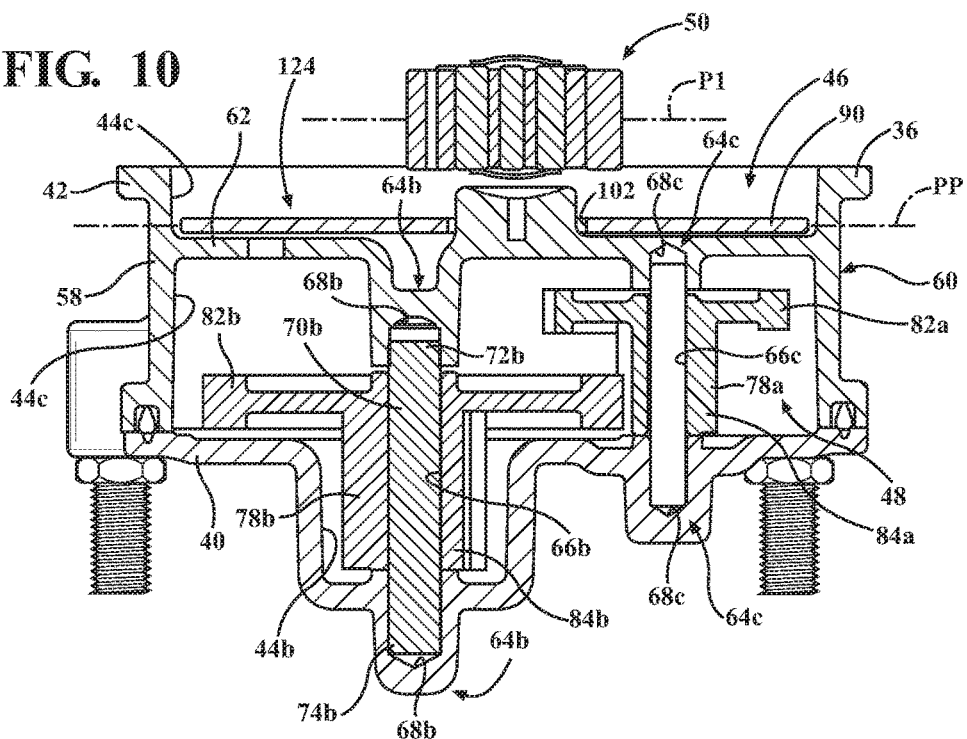
FIG. 10 is a cross-sectional view taken along 10-10 in FIG. 6, showing the first intermediate gear engaging the second intermediate gear.

As shown in FIG. 10, the at least one intermediate gear 78 may have a first gear section 82 and a second gear section 84 spaced from and fixed to the first gear section 82, with the first gear section 82 being engageable with the at least one drive gear 54 and the second gear section 84 being engageable with the output gear 76. More specifically, the at least one intermediate gear 78 may include a first intermediate gear 78a and a second intermediate gear 78b with each of the first and second intermediate gears 78a, 78b having the first and second gear sections 82a, 82b, 84a, 84b. Both of the first and second gear sections 82a, 82b, 84a, 84b of both of the first and second intermediate gears 78a, 78b may have gear teeth extending radially. Both of the first and second gear sections 82a, 82b, 84a, 84b of both of the first and second intermediate gears 78a, 78b may have a substantially circular configuration. As such, both of the first and second intermediate gears 78a, 78b may be referred to as two spur gears. In addition, the first and second gear sections 82a, 82b, 84a, 84b of the respective first and second intermediate gears 78a, 78b may be fixed to one another such that the first and second gear sections 82a, 82b, 84a, 84b rotate in unison. As such, each of the first and second intermediate gears 78a, 78b may be referred to as a compound gear. One having skill in the art will appreciate that the first and second intermediate gears 78a, 78b may have any suitable gear configuration, such as a bevel gear configuration.

The first gear section 82a of the first intermediate gear 78a may be engageable with the at least one drive gear 54, as shown in FIGS. 5, 7, and 9. More specifically, the gear teeth of the first gear section 82a of the first intermediate gear 78a may be engageable with the gear teeth of the at least one drive gear 54 to define a first gear stage. The second gear section 84a of the first intermediate gear 78a may be engageable with the first gear section 82b of the second intermediate gear 78b, as shown in FIGS. 5 and 10. More specifically, the gear teeth of the second gear section 84a of the first intermediate gear 78a may be engageable with the gear teeth of the first gear section 82b of the second intermediate gear 78b to define a second gear stage. The second gear section 84b of the second intermediate gear 78b may be engageable with the output gear 76, as shown in FIGS. 5 and 11. More specifically, the gear teeth of the second gear section 84b of the second intermediate gear 78b may be engageable with the gear teeth of the output gear 76 to define a third gear stage. One having skill in the art will appreciate that the at least one intermediate gear 78 may include a single intermediate gear 78 which would define only a first and second gear stage. Furthermore, the at least one intermediate gear 78 may be any number of intermediate gears 78 defining any number of gear stages.

As described above, the description of the gear retention feature 64 is applicable to the at least one intermediate gear 78. Moreover, the description of the gear retention feature 64 is applicable both of the first and second intermediate gears 78a, 78b.

As shown in FIG. 10, each of the first and second intermediate gears 78a, 78b may respectively define the hole 66b, 66c extending therethrough, with the hole 66b, 66c corresponding with the respective gear retention feature 64b, 64c for each of the first and second intermediate gears 78a, 78b to facilitate coupling of the at least one driven gear 56 with the housing 36. Each of the second and third sections 40, 42 of the housing 36 may define the pockets 68b, 68c for each of the first and second intermediate gears 78a, 78b.

The gear pin 70 described above may be a plurality of gear pins 70a, 70b individually corresponding with the holes 66b, 66c of the first and second intermediate gears 78a, 78b. Each of the gear pins 70a, 70b extend through the respective hole 66b, 66c of each of the first and second intermediate gears 78a, 78b. The first end 72a, 72b of each of the gear pins 70a, 70b may be disposed in the respective pocket 68b, 68c defined by the third section 42 of the housing 36 and the second end 74a, 74b of each of the gear pins 70a, 70b may be disposed in the respective pocket 68b, 68c defined by the second section 40 of the housing 36 to facilitate rotatable coupling of each of the first and second intermediate gears 78a, 78b with the second and third sections 40, 42 of the housing 36.

Each of the at least one drive gear 54 and the at least one driven gear 56 may be substantially parallel, as shown in FIGS. 7, 9-11, and 14. More specifically, the gear pins 70a, 70b of the first and second intermediate gears 78a, 78b, the drive shaft 52 to which the drive gear 54 may be coupled, and the output shaft 22 to which the output gear 76 may be coupled may all be substantially parallel. One having skill in the art will appreciate that the gear pins 70a, 70b may be transverse to one another.

The operation of transmitting rotation from the motor assembly 50 to the output shaft 22 in accordance with the embodiment shown in the Figures is described below for illustrative purposes. One having skill in the art will appreciate that, although not expressly recited herein, numerous operations are possible in accordance with the present invention.

When the motor assembly 50 is activated, the motor assembly 50 rotates the drive shaft 52 about the shaft axis S. The drive shaft 52 is coupled to the at least one drive gear 54, which causes the at least one drive gear 54 to rotate. The at least one drive gear 54 engages the first gear section 82a of the first intermediate gear 78a at the first stage, which causes the first intermediate gear 78a to rotate. The first gear section 82a and the second gear section 84a of the first intermediate gear 78a are fixed to one another. As such, rotation of the first gear section 82a results in simultaneous rotation of the second gear section 84a.

The second gear section 84a of the first intermediate gear 78a engages the first gear section 82b of the second intermediate gear 78b at the second stage, which causes the second intermediate gear 78b to rotate. The first gear section 82b and the second gear section 84b of the second intermediate gear 78b are fixed to one another. As such, rotation of the first gear section 82b results in simultaneous rotation of the second gear section 84b. The second gear section 84b of the second intermediate gear 78b engages the output gear 76 at the third stage, which causes the output gear 76 to rotate. The output gear 76 is coupled to the output shaft 22, which causes the output shaft 22 to rotate about the output axis O between the plurality of positions.

The motor assembly 50 may be coupled to the third section 42 of the housing 36. More specifically, the primary circuit board 90 may be disposed within the first cavity 46 and may be coupled to the third section 42 of the housing 36. As shown in FIGS. 7-11 and 14, the primary circuit board 90 may be substantially planar and may lie along the third section 42. Furthermore, the primary circuit board 90 may be fixed to the housing 36. As shown in the Figures, the primary circuit board 90 may directly abut the third section 42. One having skill in the art will appreciate that the primary circuit board 90 may be spaced from the third section 42, but may still coupled to the third section 42, for example, by way of a shim or adhesive disposed between the primary circuit board 90 and the third section 42.

Figure 6:
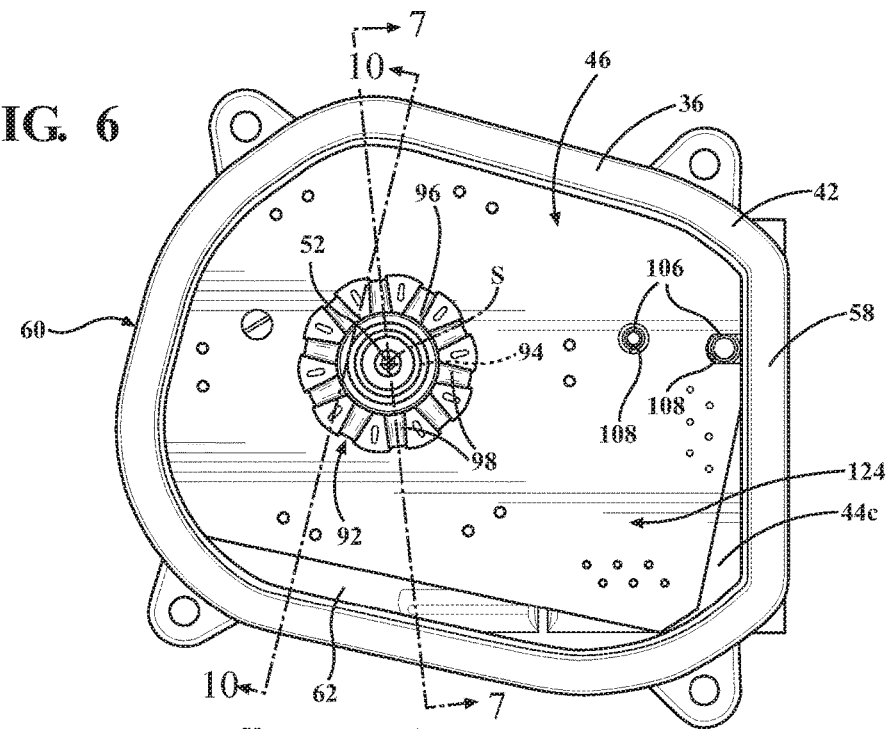
FIG. 6 is a top elevational view of the third section of the housing and showing a rotor of the motor assembly.

As shown in FIGS. 5, 6, and 9, the third section 42 may have at least one stud 106 extending into the first cavity 46, with the primary circuit board 90 defining a recess 108 for receiving the stud 106 such that the stud 106 and the recess 108 position the primary circuit board 90 within the first cavity 46 and fix the primary circuit board 90 to the third section 42. The at least one stud 106 may be substantially perpendicular to the primary circuit board 90. The at least one stud 106 may extend into the first cavity 46 at any suitable angle. The recess 108 may be configured and sized to receive the stud 106 and to couple and align the primary circuit board 90 to the third section 42 of the housing 36. The at least one stud 106 may be integral with the third section 42, as shown in FIGS. 3 and 6. Alternatively, the at least one stud 106 may be integral with the second section 40. Furthermore, the at least one stud 106 may be comprised of molded plastic. Alternatively, the actuator assembly 20 may further comprise a support pin 110 as the at least one stud 106, with the support pin 110 coupled to the third section 42 and extending into the first cavity 46, as shown in FIG. 9. Furthermore, the actuator assembly 20 may further comprise the gear pin 70 extending through the third section 42 of the housing 36 as the at least one stud 106, with the gear pin 70 extending into the first cavity 46, as also shown in FIG. 9.

The third section 42 of the housing 36 may be comprised of a metallic material, with the coupling of the motor assembly 50 with the third section 42 providing a heat sink for the motor assembly 50 through the third section 42. More specifically, the primary circuit board 90 may produce a level of heat while distributing the electricity, as described above. The third section 42 coupled to the primary circuit board 90 may provide a heat sink to transfer heat from the primary circuit board 90 to the third section 42, thereby cooling the primary circuit board 90. Moreover, the third section 42 may transfer heat to the exterior 60 of the housing 36, thereby cooling the actuator assembly 20 as a whole. The metallic material of the third section 42 may be aluminum. One having skill in the art will appreciate that the third section 42 may be comprised of any other thermally conductive material. One having skill in the art will also appreciate that a thermally conductive insulator may be used to electrically insulate the primary circuit board 90 from the third section 42.

Figure 12:
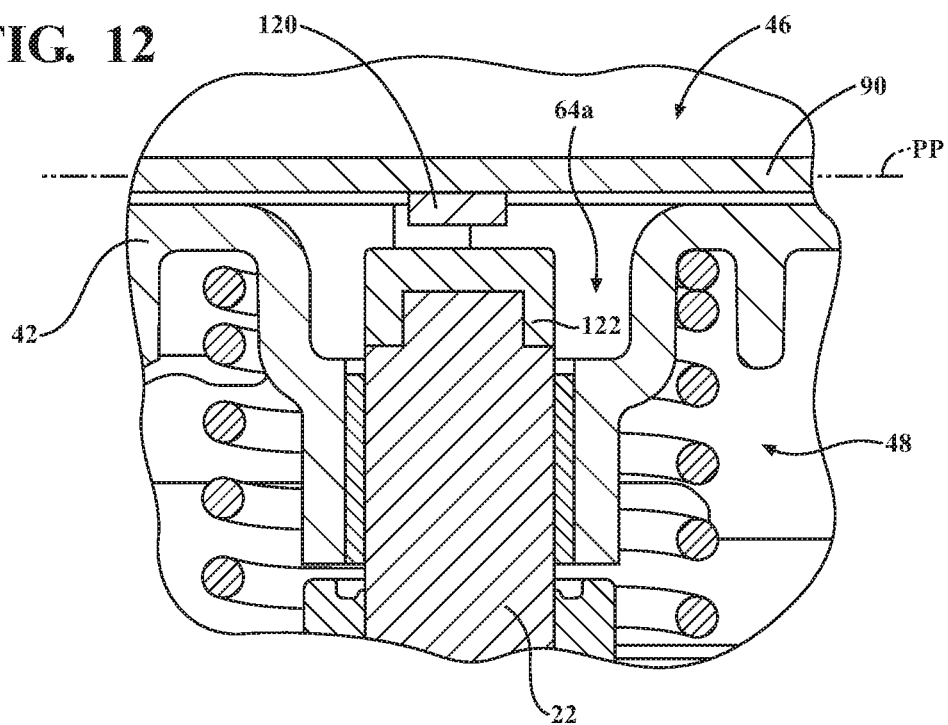
FIG. 12 is a cross-sectional view of a portion of actuator assembly and showing an output shaft sensor coupled to the primary circuit board and an output shaft magnet coupled to the output shaft.
Figure 13:
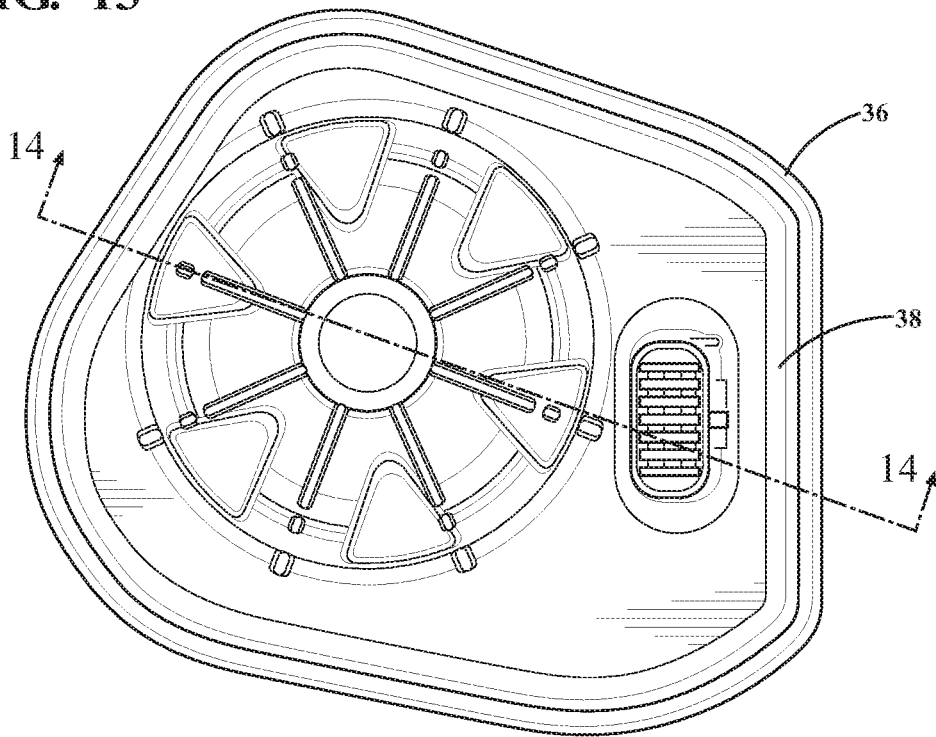
FIG. 13 is a top elevational view of an actuator assembly having the third section enveloped by the first and second sections.

As shown in FIGS. 11, 12, and 14, the actuator assembly 20 may further comprise an output shaft sensor 120 and an output shaft magnet 122 for sensing the rotational position of the output shaft 22. The output shaft sensor 120 may be fixed to, and electrically coupled with, the primary circuit board 90 while the output shaft magnet 122 may be coupled to a distal end of the output shaft 22, adjacent the primary circuit board 90. One having skill in the art will appreciate that the opposite may be true (i.e., the output shaft magnet 122 may be coupled to the primary circuit board 90 and the output shaft sensor 120 may be coupled to the output shaft 22). The output shaft magnet 122 may be coupled to the output shaft 22 by over molding (as shown in FIGS. 11, 12, and 14), adhesive, snap fit, or any other suitable manner. As non-limiting examples, the output shaft sensor 120 may comprise one of a Hall Effect Device (HED), an inductive sensor, a magneto-resistive sensor for sensing a change in the magnetic field of the output shaft magnet 122 as the output shaft magnet 122 rotates with the output shaft 22.

Although the motor assembly 50 is described herein as being used to rotate the output shaft 22, one having skill in the art will appreciate that the motor assembly 50 may be used in other applications, including (but not limited to) a solenoid and a window regulator.

Another example of an actuator assembly is disclosed in U.S. patent application Ser. No. 15/492,051, entitled "Actuator Assembly Having At Least One Driven Gear Coupled To A Housing," filed on Apr. 20, 2017, the disclosure of which is hereby incorporated by reference in its entirety.

The invention has been described in an illustrative manner, and it is to be understood that the terminology which has been used is intended to be in the nature of words of description rather than of limitation. As is now apparent to those skilled in the art, many modifications and variations of the subject invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. A circuit board assembly for use with a motor assembly having a drive shaft which is rotatable about a shaft axis and at least one magnet coupled to and rotatable with the drive shaft about the shaft axis, said circuit board assembly comprising:
- a primary circuit board extending in a first plane and configured to control electrical distribution;
- a secondary circuit board extending in a second plane, different from said first plane, with said primary and secondary circuit boards spaced from and substantially parallel with one another, and with said secondary circuit board abutting said primary circuit board such that said primary and secondary circuit boards are electrically coupled to one another; and
- at least one sensor disposed on said secondary circuit board and electrically coupled to said secondary circuit board such that said at least one sensor is electrically coupled to said primary circuit board through said secondary circuit board, with said secondary circuit board configured to position said at least one sensor in proximity with the at least one magnet for detecting the position of the at least one magnet;
- wherein said secondary circuit board is surface mounted to said primary circuit board.

2. The circuit board assembly as set forth in claim 1, wherein said primary circuit board defines a hole, configured to be aligned with the shaft axis, for accepting the drive shaft therethrough.

3. The circuit board assembly as set forth in claim 2, wherein said secondary circuit board at least partially encircles said hole of said primary circuit board.

4. The circuit board assembly as set forth in claim 3, wherein said secondary circuit board has a semi-annular configuration about said hole of said primary circuit board.

5. The circuit board assembly as set forth in claim 1, wherein said at least one sensor is a plurality of sensors, configured to be radially spaced about said shaft axis on said secondary circuit board.

6. The circuit board assembly as set forth in claim 5, wherein said plurality of sensors are defined along a sensor plane configured to be transverse to the shaft axis.

7. The circuit board assembly as set forth in claim 1, wherein said plurality of sensors is further defined as three sensors for detecting the magnet with the motor assembly in a three-phase configuration.

8. The circuit board assembly as set forth in claim 1, wherein said at least one sensor is further defined as at least one Hall Effect sensor.

9. The circuit board assembly as set forth in claim 1, further comprising a solder, with said secondary circuit board surface mounted to said primary circuit board by said solder.

10. A motor assembly for a vehicle, said motor assembly comprising:
- a drive shaft rotatable about a shaft axis;
- at least one magnet coupled to and rotatable with said drive shaft about said shaft axis; and
- a circuit board assembly spaced from said at least one magnet; said circuit board assembly comprising:
  - a primary circuit board extending in a first plane and configured to control electrical distribution;
  - a secondary circuit board extending in a second plane, different from said first plane, with said primary and secondary circuit boards spaced from and substantially parallel with one another, and with said secondary circuit board abutting said primary circuit board such that said primary and secondary circuit boards are electrically coupled to one another; and
  - at least one sensor disposed on said secondary circuit board and electrically coupled to said secondary circuit board such that said at least one sensor is electrically coupled to said primary circuit board through said secondary circuit board, with said secondary circuit board positioning said at least one sensor in proximity with said at least one magnet for detecting the position of said at least one magnet;
  - wherein said secondary circuit board is surface mounted to said primary circuit board.

11. The motor assembly as set forth in claim 10, wherein said at least one magnet is further defined as a motor magnet which facilitates rotation of said drive shaft about said shaft axis.

12. The motor assembly as set forth in claim 10, wherein said primary circuit board defines a hole aligned with said shaft axis to accept said drive shaft therethrough.

13. The motor assembly as set forth in claim 12, wherein said secondary circuit board at least partially encircles said hole of said primary circuit board.

14. The motor assembly as set forth in claim 13, wherein said secondary circuit board has a semi-annular configuration about said hole of said primary circuit board.

15. The motor assembly as set forth in claim 10, wherein said at least one sensor is a plurality of sensors radially spaced about said shaft axis on said secondary circuit board.

16. The motor assembly as set forth in claim 15, wherein said plurality of sensors are defined along a sensor plane transverse to said shaft axis.

17. The motor assembly as set forth in claim 16, wherein said at least one magnet is further defined as plurality of magnets spaced about said shaft axis and disposed along a magnet plane that is substantially parallel to said sensor plane of said plurality of sensors.

18. The motor assembly as set forth in claim 10, wherein said plurality of sensors is further defined as three sensors for detecting the magnet with the motor assembly in a three-phase configuration.

19. The motor assembly as set forth in claim 10, wherein said at least one sensor is further defined as at least one Hall Effect sensor.

20. The motor assembly as set forth in claim 10, further comprising a solder, with said secondary circuit board surface mounted to said primary circuit board by said solder.

* * * * *

UNITED STATES PATENT AND TRADEMARK OFFICE
CERTIFICATE OF CORRECTION

| | |
|---|---|
| PATENT NO. | : 10,004,142 B1 |
| APPLICATION NO. | : 15/492114 |
| DATED | : June 19, 2018 |
| INVENTOR(S) | : Brian C. Wightman |

It is certified that error appears in the above-identified patent and that said Letters Patent is hereby corrected as shown below:

In the Claims

Claim 7, Column 15, Line 41, delete "1" and replace with -- 5 --

Claim 18, Column 16, Line 45, delete "10" and replace with -- 15 --

Signed and Sealed this
Eleventh Day of December, 2018

Andrei Iancu
*Director of the United States Patent and Trademark Office*